United States Patent
Tian et al.

(10) Patent No.: US 11,014,457 B2
(45) Date of Patent: May 25, 2021

(54) COMBINED BATTERY SYSTEM AND MANAGEMENT METHOD

(71) Applicant: XIHUA UNIVERSITY, Chengdu (CN)

(72) Inventors: Wei Tian, Chengdu (CN); Xun Zhang, Chengdu (CN); Yunlu Chu, Chengdu (CN); Bang Xiao, Chengdu (CN); Mingyan Hu, Chengdu (CN); Zhiqiang Han, Chengdu (CN)

(73) Assignee: XIHUA UNIVERSITY, Chengdu (CN)

(*) Notice: Subject to any disclaimer, the term of this patent is extended or adjusted under 35 U.S.C. 154(b) by 0 days.

(21) Appl. No.: 16/959,157

(22) PCT Filed: Jan. 2, 2019

(86) PCT No.: PCT/CN2019/070089
§ 371 (c)(1),
(2) Date: Jun. 30, 2020

(87) PCT Pub. No.: WO2019/134646
PCT Pub. Date: Jul. 11, 2019

(65) Prior Publication Data
US 2020/0338992 A1    Oct. 29, 2020

(30) Foreign Application Priority Data
Jan. 5, 2018   (CN) .................. 201810010600.4

(51) Int. Cl.
*H01M 2/10* (2006.01)
*B60L 50/64* (2019.01)
(Continued)

(52) U.S. Cl.
CPC .............. *B60L 50/64* (2019.02); *B60L 58/10* (2019.02); *G01R 31/382* (2019.01);
(Continued)

(58) Field of Classification Search
CPC .... B60L 50/64; B60L 58/10; B60L 2240/547; G01R 31/382; H01M 10/44;
(Continued)

(56) References Cited

U.S. PATENT DOCUMENTS 5,017,441 A * 5/1991 Lindner ............... H01M 50/502
429/9

FOREIGN PATENT DOCUMENTS

CN    102110840 A    6/2011
CN    204441348    *  7/2015
(Continued)

OTHER PUBLICATIONS

JP 2001006652 MT (Year: 1999).*
CN204441348 MT (Year: 2015).*

*Primary Examiner* — Alexander Usyatinsky
(74) *Attorney, Agent, or Firm* — Bayramoglu Law Offices LLC (57) ABSTRACT

A battery system includes the battery compartment, haploid battery, polyploid battery and power management system; the bottom of battery compartment is divided into several elementary unit compartments provided with power jacks at four corners; each power jack is connected through a wire to form a power output terminal, then connected to the input terminal of the power management system; the size of the haploid battery matches that of a single elementary unit compartment, the polyploid battery isn't arranged in a single row, and two power contacts matching with the power jack are arranged on the diagonal of the battery's bottom surface; after power on, the power management system applies logics to determine models of the batteries in different positions of the battery compartment according to the voltage signal detected, then integrate voltage of each battery to the voltage required by appliance.

4 Claims, 8 Drawing Sheets

(51) Int. Cl.
  *G01R 31/382* (2019.01)
  *B60L 58/10* (2019.01)
  *H01M 10/44* (2006.01)
  *H01M 10/48* (2006.01)
  *H01M 50/20* (2021.01)
  *H01M 50/502* (2021.01)

(52) U.S. Cl.
  CPC ....... *H01M 10/441* (2013.01); *H01M 10/482* (2013.01); *H01M 50/20* (2021.01); *H01M 50/502* (2021.01); *H01M 2220/20* (2013.01)

(58) Field of Classification Search
  CPC .......... H01M 10/48; H01M 2/10; H01M 2/20; H01M 2220/20; Y02T 10/70; Y02E 60/10
  See application file for complete search history.

(56) References Cited

FOREIGN PATENT DOCUMENTS

| | | | |
|---|---|---|---|
| CN | 204441348 U | | 7/2015 |
| CN | 108054321 A | | 5/2018 |
| CN | 207705269 U | | 8/2018 |
| JP | 2001006652 | * | 8/1999 |
| JP | 2010140857 | * | 6/2010 |
| JP | 2010140857 A | | 6/2010 |

* cited by examiner

COMBINED BATTERY SYSTEM AND MANAGEMENT METHOD

CROSS REFERENCE TO THE RELATED APPLICATIONS

This application is the national phase entry of International Application PCT/CN2019/070089, filed on Jan. 2, 2019, which is based upon and claims priority to Chinese Patent Application No. 201810010600.4, filed on Jan. 5, 2018, the entire contents of which are incorporated herein by reference.

TECHNICAL FIELD

The invention involves the technical field of electric vehicles, in particular a combined battery system and its control method.

BACKGROUND

With the constant change of the world energy structure, the market share of electric vehicles in the field of transportation is gradually increasing. Currently, the mainstream electric vehicles mainly apply the method of electric motor drive provided by the battery, and then realize the movement of vehicles by driving the wheels through the electric motor. However, the limited battery capacity now carried by electric vehicles confines the further improvement of its driving mileage, and further restricts the promotion and application of electric vehicles. In order to overcome the small capacity of electric vehicle batteries, the most popular technology is to install charging stations on the road to recharge the batteries. However, the long charging time cannot adapt to the current fast-paced market demand. A more feasible method is to store batteries with sufficient power at charging stations. A vehicle that needs to be recharged only needs to change the battery to continue on its way, which will greatly save the charging time. However, the batteries for existing vehicles are generally heavy, inconvenient for handling and replacement. Therefore, the invention designs a combined battery system and a management method.

SUMMARY

In view of above problems, this invention aims to provide a combined battery system and a management method that can be arranged according to the dimension and structural form of battery compartments in different vehicle spaces and is convenient for rapid replacement and installation. The technical scheme is as follows:

A combined battery system, including battery compartment, haploid battery and power management system; the bottom of the battery compartment is divided into several elementary unit compartments, and each elementary unit compartment is provided with power jacks at the four corners; each power jack is connected through a wire to form a power output terminal, which is then connected to the input terminal of the power management system; the size of the haploid battery matches that of a single elementary unit compartment, with two power contacts matching with the power jack arranged on the diagonal of the bottom surface.

Additionally, it also includes the polyploid battery, and two power contacts matching the power jack are arranged on the diagonal of the bottom side of the polyploid battery.

Furthermore, the elementary unit compartments are separated with each other by convex edges, and the grooves matching with the convex edges are designed at the bottom of polyploid battery.

A control method of the combined battery system, including the following steps:

Step 1: check all elementary unit compartments for existence of voltage;

Step 2: if so, it is judged that haploid batteries are installed in all elementary unit compartments, and then enter into Step 3. If not, go to Step 4;

Step 3: check whether the positive and negative terminals of the haploid battery voltage in each elementary unit compartment are consistent with the preset condition:

If so, finish the judgment;

If not, adjust the power polarity of the circuit which is with a negative voltage in the power management module to make it conform to the preset polarity, and finish the judgment;

Step 4: determine whether the positive or negative terminals of the haploid battery voltage in each elementary unit compartment with a voltage are consistent with the preset condition:

If so, record the coordinates of the corresponding elementary unit compartment;

If not, adjust the power polarity of the circuit which is with a negative voltage in the power management module to make it conform to the preset polarity, record the coordinates of the corresponding elementary unit compartment;

Step 5: check the voltages $U(x-1, y)$, $U(x+1, y)$, $U(x, y-1)$, $U(x, y+1)$ of the adjacent elementary unit compartments $C(x-1, y)$, $C(x+1, y)$, $C(x, y-1)$, $C(x, y+1)$ on the left, right, top and bottom of any elementary unit compartment $C(x, y)$ without a voltage;

Step 6: determine whether $U(x-1, y)*U(x+1, y)*U(x, y-1)*U(x, y+1)=0$ is valid or not:

If $U(x-1, y)*U(x+1, y)*U(x, y-1)*U(x, y+1)=0$ is not valid, it is judged that there is no battery installed in the elementary unit compartment $C(x, y)$. Record the coordinates of this elementary unit compartment and go to Step 8;

If $U(x-1, y)*U(x+1, y)*U(x, y-1)*U(x, y+1)=0$ is valid, go to Step 7;

Step 7: determine whether the polyploid battery is installed in the elementary unit compartment $C(x, y)$, and determine which elementary unit compartments around the elementary unit compartment $C(x, y)$ will constitute the installation position of the polyploid battery together with the elementary unit compartment $C(x, y)$, and record the coordinates of the corresponding elementary unit compartments, then enter Step 8;

Step 8: check whether all battery compartments have been tested: if not, return to Step 5; if so, finish the judgment.

Furthermore, the specific procedures for Step 7 shown are as follows:

Step a: establish a plane coordinate system by taking the elementary unit compartment $C(x, y)$ as the center of the circle, and the horizontal direction as X axis while the vertical direction as Y axis. Determine whether the elementary unit compartment $C(x, y)$ can constitute the installation position of polyploid battery together with the first quadrant, positive x-axis direction and positive y-axis direction:

Step a1: assign 1 to x0;

Step a2: check whether the voltage $U(x+x0, y)=0$ of the elementary unit compartment $C(x+x0, y)$ on the right side of the elementary unit battery compartment $C(x, y)$ is valid:

If U(x+x0, y)=0 is not valid, the haploid battery is installed in the elementary unit compartment C(x+x0, y), then go to Step e; if U(x+x0, y)=0 is valid, then go to the next step;

Step a3: check whether the diploid voltage U((x+x0, y), (x, y))=0 between the elementary unit compartments C(x+x0, y) and C(x, y) is valid:

If U((x+x0, y), (x, y))=0 is not valid, the (x0+1) polyploid battery is provided between C(x+x0, y) and C(x, y), then go to Step e;

If U((x+x0, y), (x, y))=0 is valid, assign 1 to y0 and go to the next step; Step a4: check whether the voltage U(x, y+y0)=0 of the elementary unit battery compartment C(x, y+y0) at the upper adjacent of the elementary unit compartment C(x, y) is valid:

If U(x, y+y0)=0 is not valid, the haploid battery is installed in the battery compartment C(x, y+y0), then go to Step e;

If U(x, y+y0)=0 is valid, then go to the next step; Step a5: check whether the diploid voltage U((x, y+y0), (x, y))=0 between C(x, y+y0) and C(x, y) is valid:

If U((x, y+y0), (x, y))=0 is not valid, the (y0+1) polyploid battery is provided between C(x, y+y0) and C(x, y), then go to Step e;

If U((x, y+y0), (x, y))=0 is valid, go to the next step;

Step a6: check whether the voltage U((x+x0, y+y0), C(x, y))=0 between two elementary unit compartments C(x+x0, y+y0) and C(x, y) is valid:

If U((x+x0, y+y0), C(x, y))=0 is not valid, all the elementary units in the rectangular region with C(x+x0, y+y0) and C(x, y) as the diagonal are used to form (x0+1)×(y0+1) polyploid battery, then go to Step e;

If U((x+x0, y+y0), C(x, y))=0 is valid, go to the next step;

Step a7: check whether the voltage U((x, y+y0), C(x+x0, y))=0 between two elementary unit compartments C(x, y+y0) and C(x+x0, y) is valid:

If U((x, y+y0), C(x+x0, y))=0 is not valid, all the elementary unit compartments in the rectangular region with C(x, y+y0) and C(x+x0, y) as the diagonal are used to form (x0+1)×(y0+1) polyploid battery, then go to Step e;

If U((x, y+y0), C(x+x0, y))=0 is valid, ensure y0=y0+1 and go to the next step;

Step a8: determine whether y0=Y is valid, in which, Y is the maximum row value in the column of C(x, Y);

If y0=Y is not valid, return to Step a4;

If y0=Y is valid, ensure x0=x0+1 and go to the next step;

Step a9: determine whether x0=X is valid, in which, X is the maximum row value+1 in the column of C(x, y);

If x0=X is not valid, return to Step a2;

If x0=X is valid, go to the next step;

Step b: use the same method from Step a1 to Step a9 to determine whether the elementary unit compartment C(x, y) can constitute the installation position of polyploid battery together with the second quadrant, negative x-axis direction and positive y-axis direction; if so, enter Step e; otherwise enter the next step;

Step c: use the same method from Step a1 to Step a9 to determine whether the elementary unit compartment C(x, y) can constitute the installation position of polyploid battery together with the third quadrant, negative x-axis direction and negative y-axis direction; if so, enter Step e; otherwise enter the next step;

Step d: use the same method from Step a1 to Step a9 to determine whether the elementary unit compartment C(x, y) can constitute the installation position of polyploid battery together with the fourth quadrant, positive x-axis direction and negative y-axis direction; if so, enter Step e; otherwise determine that the battery is not installed in the elementary unit compartment, and record the coordinates of this elementary unit compartment;

Step e: record the coordinates of each elementary unit corresponding to the haploid battery installation position or the polyploid battery installation position.

The beneficial effects of this invention are: the invention can design the dimension and structure of the battery compartment according to different vehicle spaces; change and select the batteries in different sizes and shapes arbitrarily according to users' demands and preferences; place the battery arbitrarily thanks to the arrangement of battery contacts in the diagonal, without worrying about the correctness of battery power polarity and the placement position, which can reduce the installation difficulty; the modular battery compartment and battery form facilitate the process of rapid replacement and installation.

In the figures: 1—battery compartment, 2—haploid battery; 3—amphiploid battery; 4—power management system; 5—elementary unit; 6—power jack; 7—tetraploid battery; 8—convex edge; 9—power contact; 10—groove.

DETAILED DESCRIPTION OF THE EMBODIMENTS

Figure 1:
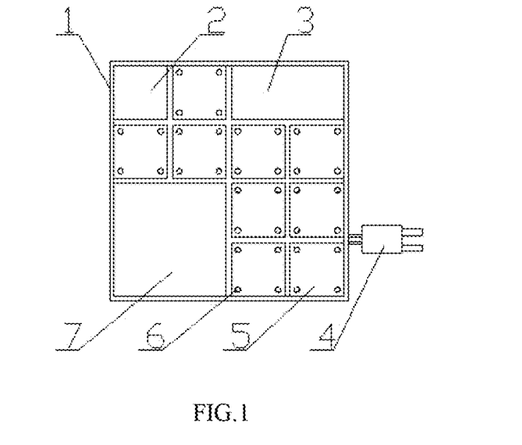
FIG. 1 shows the overhead view of battery and battery compartment assembly.
Figure 2:
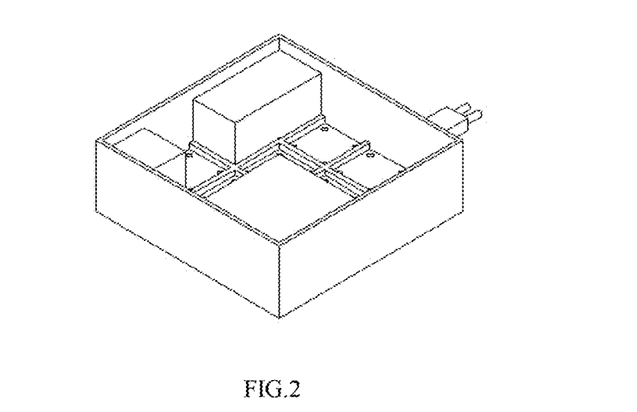
FIG. 2 shows the three-dimensional diagram of battery and battery compartment assembly.
Figure 3:
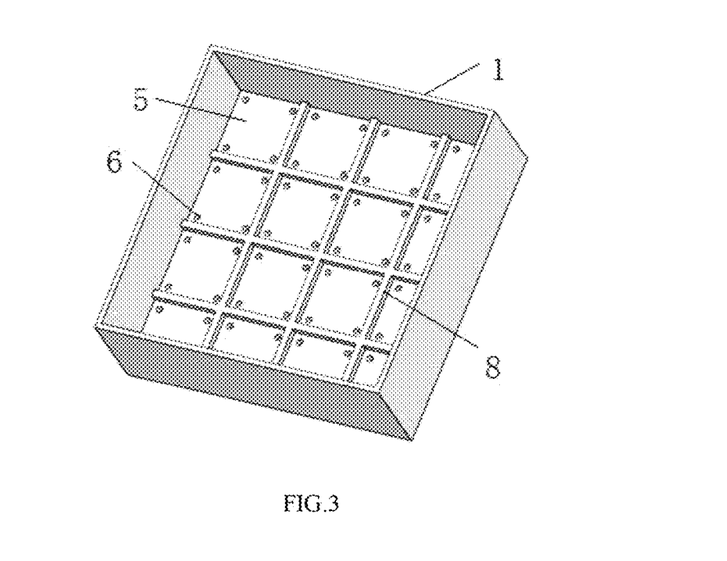
FIG. 3 is the schematic diagram of the battery compartment structure.
Figure 4:
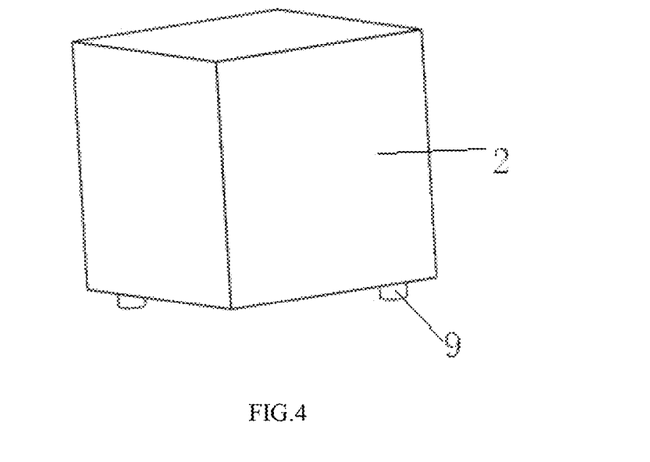
FIG. 4 is the schematic diagram of the haploid battery.

The utility model is further explained in detail by combining the attached drawings and specific embodiments. FIGS. 1 and 2 show a combined battery system, including the following featured parts: battery compartment 1, haploid battery 2 and power management system 4; the bottom of the battery compartment 1 is divided into several elementary unit compartments 5, and each elementary unit compartment 5 is provided with power jacks 6 at the four corners, as shown in FIG. 3; each power jack 6 is connected through a wire to form a power output terminal, which is then connected to the input terminal of the power management system 4, the power management system 4 is used to judge the condition of battery installation in the battery compartment and charge the battery according to the battery installation condition; the size of the haploid battery 2 matches that of a single elementary unit compartment 5, with two power contacts 9 matching with the power jack 6 arranged on the diagonal of the bottom surface, as shown in FIG. 4.

Figure 5:
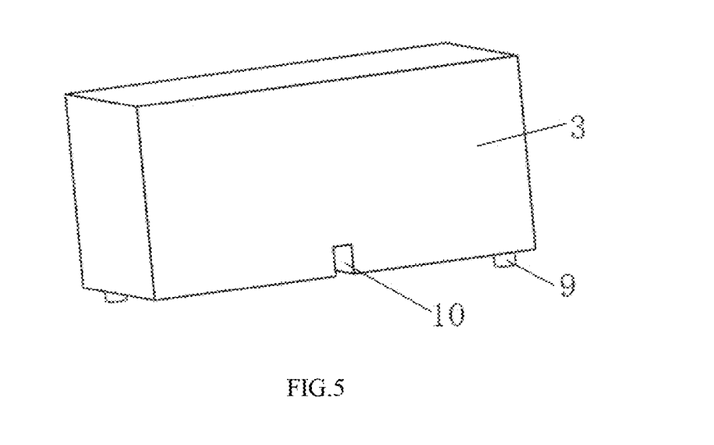
FIG. 5 is the schematic diagram of the amphiploid battery.
Figure 6:
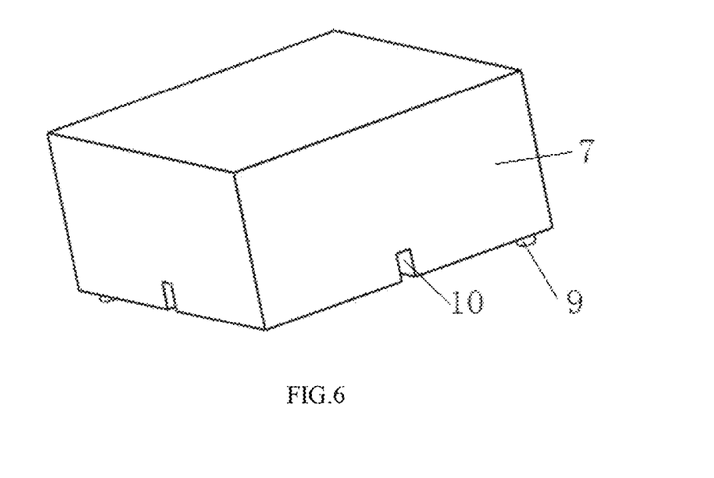
FIG. 6 is the schematic diagram of the tetraploid battery.

This embodiment also includes a polyploid battery, and also arranges two power contacts 9 matching the power jack 6 on the diagonal of the bottom side of the polyploid battery. The polyploid battery in this embodiment includes the amphiploid battery 3 and tetraploid battery 7, and the amphiploid battery 3 is matched with two adjacent elementary unit compartments, as shown in FIG. 5; the tetraploid battery 7 is matched with four elementary unit compartments 5 arranged as "matts", as shown in FIG. 6. Additionally, the elementary unit compartments 5 are separated with each other by convex edges 8, and the grooves 10 matching with the convex edges 8 are designed at the bottom of polyploid battery.

Another purpose of this invention is realized as follows: the management method of a combined battery system includes the following steps:

In the initial use, any size of the battery can be selected depending on the circumstance and put into the battery compartment 1.

Figure 7:
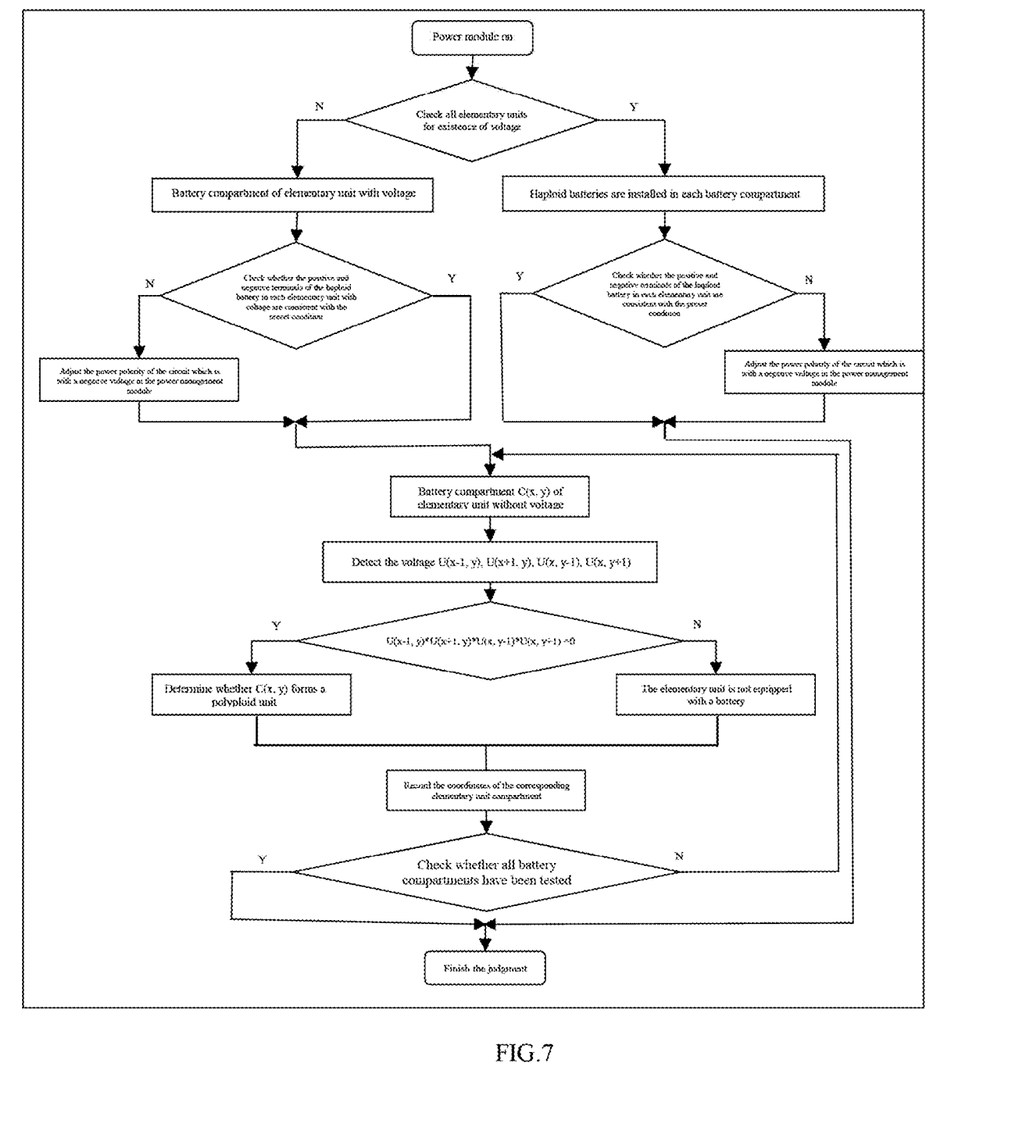
FIG. 7 is the logical block diagram of the main judgment of management method.
Figure 8:
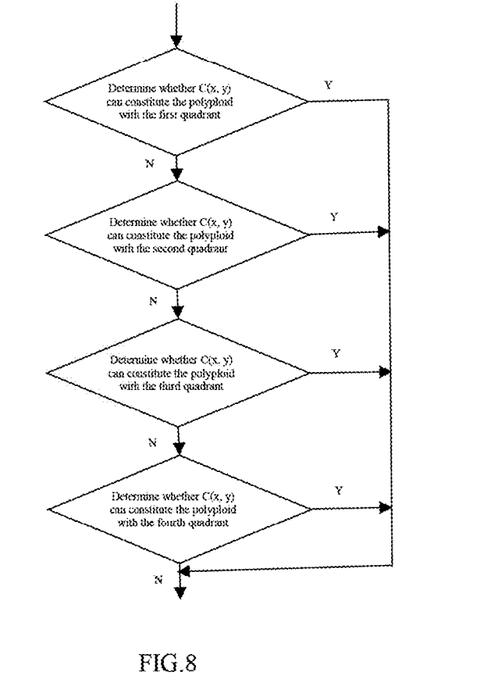
FIG. 8 is the logical block diagram for judging the installation position of polyploid battery.

After power on, the power management system 4 will apply the logics shown in FIG. 7 and FIG. 8 to determine the models of the batteries in different positions of the battery compartment according to the voltage signal detected, and then integrate the voltage of each battery to the voltage required by the appliance.

The process of the judgment method is shown in FIG. 7 and FIG. 8, which are specified as follows:

Step 1: check all elementary unit compartments for existence of voltage;

Step 2: if so, it is judged that haploid batteries are installed in all elementary unit compartments, and then enter into Step 3. If not, go to Step 4;

Step 3: check whether the positive and negative terminals of the haploid battery voltage in each elementary unit compartment are consistent with the preset condition:

If so, finish the judgment;

If not, adjust the power polarity of the circuit which is with a negative voltage in the power management module to make it conform to the preset polarity, and finish the judgment;

Step 4: determine whether the positive or negative terminals of the haploid battery voltage in each elementary unit compartment with a voltage are consistent with the preset condition:

If so, record the coordinates of the corresponding elementary unit compartment;

If not, adjust the power polarity of the circuit which is with a negative voltage in the power management module to make it conform to the preset polarity, record the coordinates of the corresponding elementary unit compartment;

Step 5: check the voltages $U(x-1, y)$, $U(x+1, y)$, $U(x, y-1)$, $U(x, y+1)$ of the adjacent elementary unit compartments $C(x-1, y)$, $C(x+1, y)$, $C(x, y-1)$, $C(x, y+1)$ on the left, right, top and bottom of any elementary unit compartment $C(x, y)$ without a voltage; in this embodiment, the coordinates of the elementary unit compartment in the lower left corner of the battery compartment are set as $C(1, 1)$.

Figure 9:
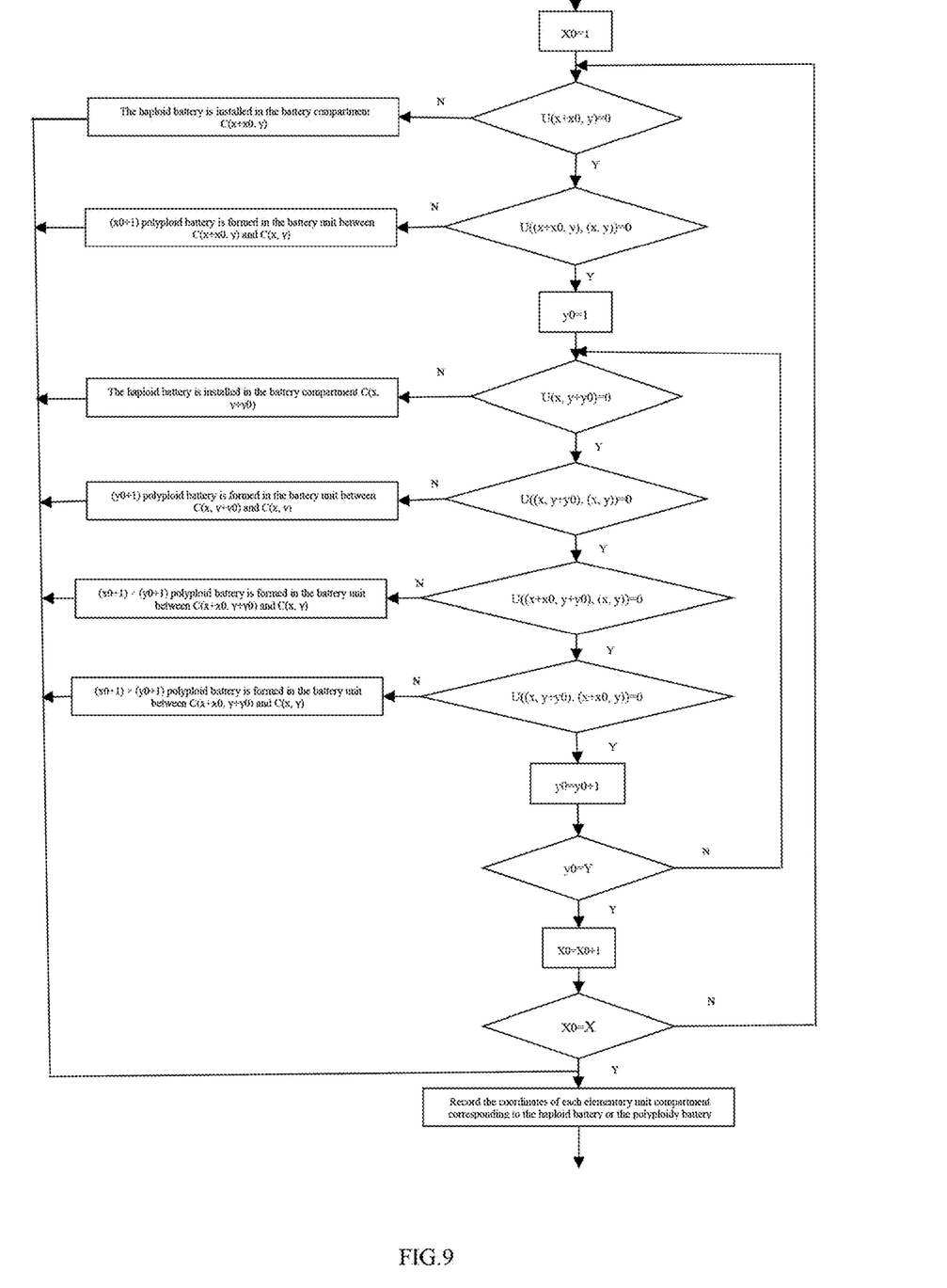
FIG. 9 is the logical block diagram for judging whether the elementary unit compartment C(x, y) can form the polyploid with the first quadrant elementary unit.
Figure 10:
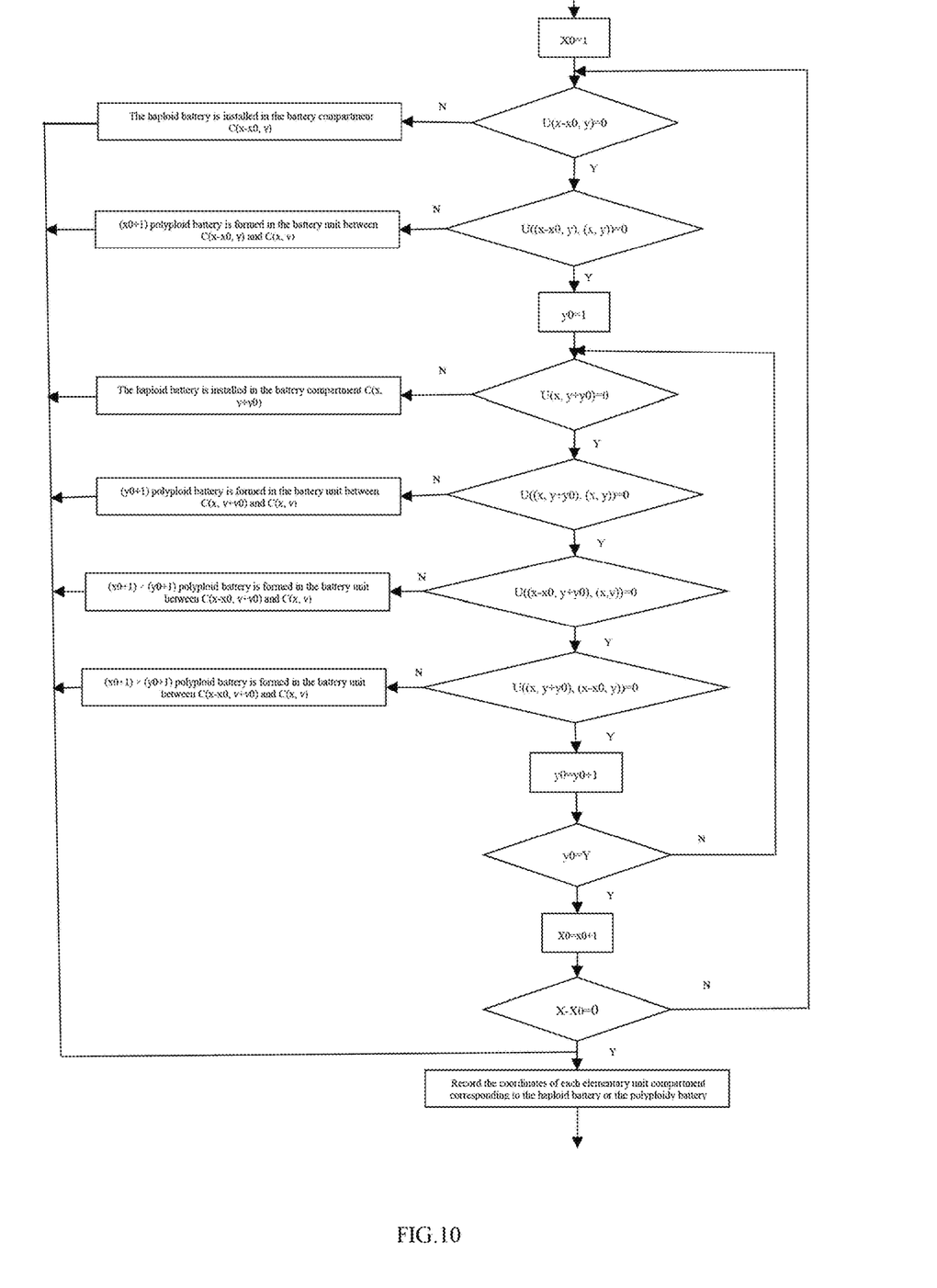
FIG. 10 is the logical block diagram for judging whether the elementary unit compartment C(x, y) can form the polyploid with the second quadrant elementary unit.
Figure 11:
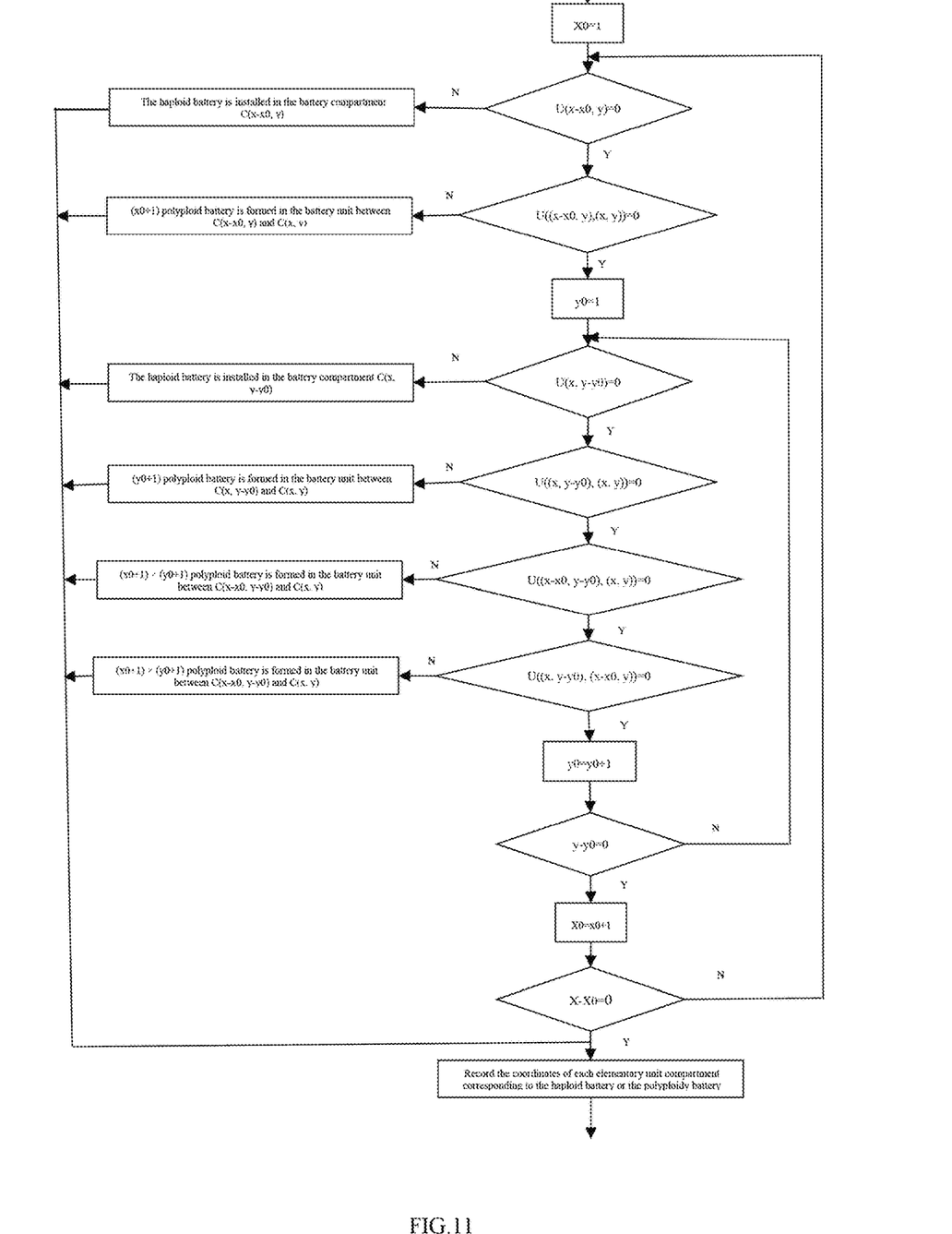
FIG. 11 is the logical block diagram for judging whether the elementary unit compartment C(x, y) can form the polyploid with the third quadrant elementary unit.
Figure 12:
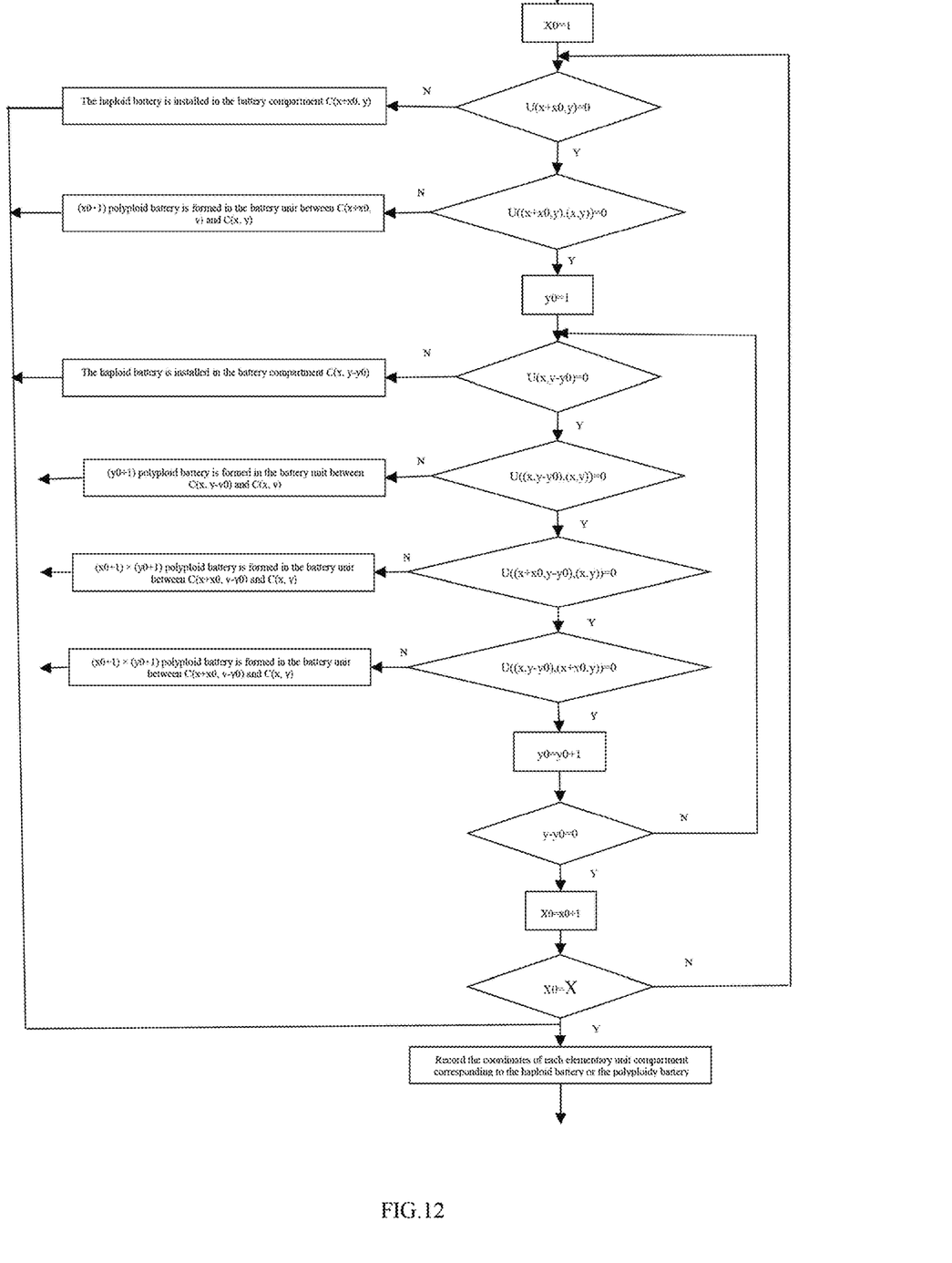
FIG. 12 is the logical block diagram for judging whether the elementary unit compartment C(x, y) can form the polyploid with the fourth quadrant elementary unit.

Step 6: determine whether $U(x-1, y)*U(x+1, y)*U(x, y-1)*U(x, y+1)=0$ is valid or not:

If $U(x-1, y)*U(x+1, y)*U(x, y-1)*U(x, y+1)=0$ is not valid, it is judged that there is no battery installed in the elementary unit compartment $C(x, y)$. Record the coordinates of this elementary unit compartment and go to Step 8;

If $U(x-1, y)*U(x+1, y)*U(x, y-1)*U(x, y+1)=0$ is valid, go to Step 7;

Step 7: determine whether the polyploid battery is installed in the elementary unit compartment $C(x, y)$, and determine which elementary unit compartments around the elementary unit compartment $C(x, y)$ will constitute the installation position of the polyploid battery together with the elementary unit compartment $C(x, y)$, and record the coordinates of the corresponding elementary unit compartments, then enter Step 8;

The specific process of this step is as follows:

Step a: establish a plane coordinate system by taking the elementary unit compartment $C(x, y)$ as the center of the circle, and the horizontal direction as X axis while the vertical direction as Y axis. Determine whether the elementary unit compartment $C(x, y)$ can constitute the installation position of polyploid battery together with the first quadrant, positive x-axis direction and positive y-axis direction. The process is shown in FIG. 9, with the specific steps as follows:

Step a1: assign 1 to x0;

Step a2: check whether the voltage $U(x+x0, y)=0$ of the elementary unit compartment $C(x+x0, y)$ on the right side of the elementary unit battery compartment $C(x, y)$ is valid:

If $U(x+x0, y)=0$ is not valid, the haploid battery is installed in the elementary unit compartment $C(x+x0, y)$, then go to Step e; if $U(x+x0, y)=0$ is valid, then go to the next step;

Step a3: check whether the diploid voltage $U((x+x0, y), (x, y))=0$ between the elementary unit compartments $C(x+x0, y)$ and $C(x, y)$ is valid:

If $U((x+x0, y), (x, y))=0$ is not valid, the (x0+1) polyploid battery is provided between $C(x+x0, y)$ and $C(x, y)$, then go to Step e;

If $U((x+x0, y), (x, y))=0$ is valid, assign 1 to y0 and go to the next step;

Step a4: check whether the voltage $U(x, y+y0)=0$ of the elementary unit battery compartment $C(x, y+y0)$ at the upper adjacent of the elementary unit compartment $C(x, y)$ is valid:

If $U(x, y+y0)=0$ is not valid, the haploid battery is installed in the battery compartment $C(x, y+y0)$, then go to Step e;

If $U(x, y+y0)=0$ is valid, then go to the next step;

Step a5: check whether the diploid voltage $U((x, y+y0), (x, y))=0$ between $C(x, y+y0)$ and $C(x, y)$ is valid:

If $U((x, y+y0), (x, y))=0$ is not valid, the (y0+1) polyploid battery is provided between $C(x, y+y0)$ and $C(x, y)$, then go to Step e;

If $U((x, y+y0), (x, y))=0$ is valid, go to the next step; Step a6: check whether the voltage $U((x+x0, y+y0), C(x, y))=0$ between two elementary unit compartments $C(x+x0, y+y0)$ and $C(x, y)$ is valid:

If $U((x+x0, y+y0), C(x, y))=0$ is not valid, all the elementary units in the rectangular region with $C(x+x0, y+y0)$ and $C(x, y)$ as the diagonal are used to form (x0+1)×(y0+1) polyploid battery, then go to Step e;

If $U((x+x0, y+y0), C(x, y))=0$ is valid, go to the next step;

Step a7: check whether the voltage $U((x, y+y0), C(x+x0, y))=0$ between two elementary unit compartments $C(x, y+y0)$ and $C(x+x0, y)$ is valid:

If $U((x, y+y0), C(x+x0, y))=0$ is not valid, all the elementary unit compartments in the rectangular region with $C(x, y+y0)$ and $C(x+x0, y)$ as the diagonal are used to form (x0+1)×(y0+1) polyploid battery, then go to Step e;

If $U((x, y+y0), C(x+x0, y))=0$ is valid, ensure y0=y0+1 and go to the next step;

Step a8: determine whether y0=Y is valid, in which, Y is the maximum row value in the column of C(x, Y);
If y0=Y is not valid, return to Step a4;
If y0=Y is valid, ensure x0=x0+1 and go to the next step;
Step a9: determine whether x0=X is valid, in which, X is the maximum row value+1 in the column of C(x, y);
If x0=X is not valid, return to Step a2;
If x0=X is valid, go to the next step;
Step b: use the same method from Step a1 to Step a9 to determine whether the elementary unit compartment C(x, y) can constitute the installation position of polyploid battery together with the second quadrant, negative x-axis direction and positive y-axis direction (the process is as shown in FIG. 10); if so, enter Step e; otherwise enter the next step;
Step c: use the same method from Step a1 to Step a9 to determine whether the elementary unit compartment C(x, y) can constitute the installation position of polyploid battery together with the third quadrant, negative x-axis direction and negative y-axis direction (the process is as shown in FIG. 11); if so, enter Step e; otherwise enter the next step;
Step d: use the same method from Step a1 to Step a9 to determine whether the elementary unit compartment C(x, y) can constitute the installation position of polyploid battery together with the fourth quadrant, positive x-axis direction and negative y-axis direction (the process is as shown in FIG. 12); if so, enter Step e; otherwise determine that the battery is not installed in the elementary unit compartment, and record the coordinates of this elementary unit compartment;
Step e: record the coordinates of each elementary unit corresponding to the haploid battery installation position or the polyploid battery installation position.
Step 8: check whether all battery compartments have been tested: if not, return to Step 5; if so, finish the judgment.
In the process of use, the power management system will monitor the residual capacity of each battery in real time, and will remind the user to replace the battery when the residual capacity of a battery is detected to be lower than the target value.

What is claimed is:
1. A combined battery system, comprising:
a battery compartment having a bottom divided into a plurality of elementary unit compartments each with a frame element that has four corners and a power jack at each corner;
a battery that is at least one of a haploid battery, an amphiploid battery, a polyploid battery, and a tetraploid battery; and
a power management system discrete from the battery compartment that manages a power and a location of the battery within the battery compartment depending upon whether the battery is the haploid battery, the amphiploid battery, the polyploid battery, or the tetraploid battery, wherein
each of the frame elements is sized to correspondingly receive the at least one of the haploid battery, the amphiploid battery, the polyploid battery, or the tetraploid battery, each power jack is electrically connected to a bus to form a power output terminal, the power output terminal is electrically connected to an input terminal of the power management system, two first power contacts arranged diagonally relative to one another on a bottom surface of the at least one of the haploid battery, the amphiploid battery and the tetraploid battery contact a corresponding jack when the at least one of the haploid battery, the amphiploid battery and the tetraploid battery is positioned in a corresponding frame element of the battery compartment,
wherein the power management system programmed to perform the following steps:
Step 1: checking whether a voltage exists in each of the plurality of elementary unit compartments;
Step 2: if the voltage exists in each of the plurality of elementary unit compartments, judging that the at least one of the haploid battery, the amphiploid battery and the tetraploid battery is installed in each of the elementary unit compartments, and then enter into Step 3, if the voltage does not exist in each of the elementary unit compartments, go to Step 4;
Step 3: checking whether positive and negative terminals of the voltage of the at least one of the haploid battery, the amphiploid battery and the tetraploid battery in each of the plurality of elementary unit compartments are consistent with a preset condition,
if the positive and negative terminals of the voltage of the at least one of the haploid battery, the amphiploid battery and the tetraploid battery in each of the plurality of elementary unit compartments are consistent with the preset condition, end the judgment;
if the positive and negative terminals of the voltage of the at least one of the haploid battery, the amphiploid battery and the tetraploid battery in each of the plurality of elementary unit compartments are not consistent with the preset condition, adjusting power polarity of a circuit with a negative voltage in a power management module to conform to a preset polarity, and end the judgment;
Step 4: determining whether the positive and negative terminals of the voltage of the at least one of the haploid battery, the amphiploid battery and the tetraploid battery in each of the plurality of elementary unit compartments with the voltage are consistent with the preset condition:
if the positive and negative terminals of the voltage of the at least one of the haploid battery, the amphiploid battery and the tetraploid battery in each of the plurality of elementary unit compartments with the voltage are consistent with the preset condition, record the coordinates of the corresponding elementary unit compartment;
if the positive and negative terminals of the voltage of the at least one of the haploid battery, the amphiploid battery and the tetraploid battery in each of the plurality of elementary unit compartments with the voltage are not consistent with the preset condition, adjust the power polarity of the circuit with the negative voltage in the power management module to be conformed to the preset polarity, record coordinates of the corresponding elementary unit compartment;
Step 5: checking voltages U(x-1, y), U(x+1, y), U(x, y-1), U(x, y+1) of adjacent elementary unit compartments C(x-1, y), C(x+1, y), C(x, y-1), C(x, y+1) on the left, right, top and bottom of an elementary unit compartment C(x, y) without a voltage;
Step 6: determining whether U(x-1, y)*U(x+1, y)*U(x, y-1)*U(x, y+1)=0 is valid or not:
if U(x-1, y)*U(x+1, y)*U(x, y-1)*U(x, y+1)=0 is not valid, judge that there is no battery installed in the elementary unit compartment C(x, y), record the coordinates of the elementary unit compartment C(x, y) and go to Step 8;

if U(x−1, y)*U(x+1, y)*U(x, y−1)*U(x, y+1)=0 is valid, go to Step 7;

Step 7: determining whether the polyploid battery is installed in the elementary unit compartment C(x, y), and determining which elementary unit compartments around the elementary unit compartment C(x, y) will constitute an installation position of the polyploid battery together with the elementary unit compartment C(x, y), and recording coordinates of a third corresponding elementary unit compartment, then enter Step 8;

Step 8: checking whether all battery compartments have been tested, if each battery compartment has not been tested, return to Step 5; if each battery compartment has been tested, end the judgment.

2. The combined battery system according to claim 1, wherein the polyploid battery comprises two second power contacts matching with the power jack are arranged diagonally relative to one another on the bottom surface of the polyploid battery.

3. The combined battery system according to claim 1, wherein the frame element of each of the plurality of elementary unit compartments includes a convex edge, and a groove that receives the convex edge is provided at the bottom of the polyploid battery.

4. The control method of the combined battery system as claimed in claim 1, wherein Step 7 further comprises:

Step a: establishing a plane coordinate system by taking an elementary unit compartment C(x, y) as the center of a circle, with a horizontal direction as X axis and a vertical direction as Y axis; determining whether the elementary unit compartment C(x, y) constitutes the installation position of the polyploid battery together with a first quadrant, in a positive x-axis direction and a positive y-axis direction;

Step a1: assigning 1 to x0;

Step a2: checking whether the voltage U(x+x0, y)=0 of the elementary unit compartment C(x+x0, y) on a right side of the elementary unit battery compartment C(x, y) is valid;

if U(x+x0, y)=0 is not valid, the at least one of the haploid battery, the amphiploid battery and the tetraploid battery is installed in the elementary unit compartment C(x+x0, y), then go to Step e; if U(x+x0, y)=0 is valid, then go to the next step;

Step a3: checking whether a diploid voltage U((x+x0, y), (x, y))=0 between the elementary unit compartments C(x+x0, y) and C(x, y) is valid;

if U((x+x0, y), (x, y))=0 is not valid, (x0+1) a polyploid battery is provided between C(x+x0, y) and C(x, y), then go to Step e;

if U((x+x0, y), (x, y))=0 is valid, assign 1 to y0 and go to the next step;

Step a4: checking whether a voltage U(x, y+y0)=0 of the elementary unit of the battery compartment C(x, y+y0) at an upper side of the elementary unit compartment C(x, y) is valid;

if U(x, y+y0)=0 is not valid, the at least one of the haploid battery, the amphiploid battery and the tetraploid battery is installed in the battery compartment C(x, y+y0), then go to Step e;

if U(x, y+y0)=0 is valid, then go to the next step;

Step a5: checking whether a diploid voltage U((x, y+y0), (x, y))=0 between C(x, y+y0) and C(x, y) is valid;

if U((x, y+y0), (x, y))=0 is not valid, (y0+1) the polyploid battery is provided between C(x, y+y0) and C(x, y), then go to Step e;

if U((x, y+y0), (x, y))=0 is valid, go to the next step;

Step a6: checking whether a voltage U((x+x0, y+y0), C(x, y))=0 between two elementary unit compartments C(x+x0, y+y0) and C(x, y) is valid;

if U((x+x0, y+y0), C(x, y))=0 is not valid, all elementary unit compartments in a rectangular region with C(x+x0, y+y0) and C(x, y) as a first diagonal are configured to form (x0+1) x (y0+1) the polyploid battery, then go to Step e;

if U((x+x0, y+y0), C(x, y))=0 is valid, go to the next step;

Step a7: checking whether a voltage U((x, y+y0), C(x+x0, y))=0 between two elementary unit compartments C(x, y+y0) and C(x+x0, y) is valid;

if U((x, y+y0), C(x+x0, y))=0 is not valid, all the elementary unit compartments in the rectangular region with C(x, y+y0) and C(x+x0, y) as a second diagonal are configured to form (x0+1) x (y0+1) the polyploid battery, then go to Step e;

if U((x, y+y0), C(x+x0, y))=0 is valid, ensuring y0=y0+1 and go to the next step;

Step a8: determining whether y0=Y is valid, wherein, Y is the maximum row value in the column of C(x, Y);

if y0=Y is not valid, return to Step a4;

if y0=Y is valid, ensuring x0=x0+1 and go to the next step;

Step a9: determining whether x0=X is valid, wherein, X is the maximum row value+1 in the column of C(x, y);

if x0=X is not valid, return to Step a2;

if x0=X is valid, go to the next step;

Step b: determining whether the elementary unit compartment C(x, y) constitutes an installation position of the polyploid battery together with a second quadrant, in a negative x-axis direction and a positive y-axis direction by a method from Step a1 to Step a9; if the elementary unit compartment C(x, y) constitutes the installation position of the polyploid battery together with the second quadrant, in the negative x-axis direction and the positive y-axis direction, enter Step e; if the elementary unit compartment C(x, y) does not constitute the installation position of the polyploid battery together with the second quadrant, in the negative x-axis direction and the positive y-axis direction enter the next step;

Step c: determining whether the elementary unit compartment C(x, y) constitutes the installation position of the polyploid battery together with a third quadrant, in the negative x-axis direction and a negative y-axis direction by the method from Step a1 to Step a9; if the elementary unit compartment C(x, y) constitutes the installation position of the polyploid battery together with the third quadrant, in the negative x-axis direction and the negative y-axis direction, enter Step e; if the elementary unit compartment C(x, y) does not constitute the installation position of the polyploid battery together with the third quadrant, in the negative x-axis direction and the negative y-axis direction enter the next step;

Step d: determining whether the elementary unit compartment C(x, y) constitutes the installation position of the polyploid battery together with a fourth quadrant, in the positive x-axis direction and the negative y-axis direction by the method from Step a1 to Step a9; if the elementary unit compartment C(x, y) constitutes the installation position of the polyploid battery together with the fourth quadrant, in the positive x-axis direction and the negative y-axis direction, enter Step e; if the elementary unit compartment C(x, y) does not constitute the installation position of the polyploid battery together with the fourth quadrant, in the positive x-axis direction and the negative y-axis direction, determining that the at least one of the haploid battery, the amphiploid battery and the tetraploid battery is not installed in the elementary unit compartment, and record the coordinates of the elementary unit compartment $C(x, y)$;

Step e: recording the coordinates of each elementary unit corresponding to an installation position of the at least one of the haploid battery, the amphiploid battery and the tetraploid battery or the installation position of the polyploid battery.

\* \* \* \* \*